United States Patent [19]
Okajima et al.

[11] Patent Number: 4,740,918
[45] Date of Patent: Apr. 26, 1988

[54] EMITTER COUPLED SEMICONDUCTOR MEMORY DEVICE HAVING A LOW POTENTIAL SOURCE HAVING TWO STATES

[75] Inventors: Yoshinori Okajima, Kawasaki; Tomoharu Awaya, Yokohama, both of Japan

[73] Assignee: Fujitsu Limited, Kawasaki, Japan

[21] Appl. No.: 762,520

[22] Filed: Aug. 5, 1985

[30] Foreign Application Priority Data

Aug. 10, 1984 [JP] Japan ................................. 59-167395

[51] Int. Cl.$^4$ .......................... G11C 5/06; G11C 11/34
[52] U.S. Cl. ...................................... 365/72; 365/226; 365/227
[58] Field of Search ................. 365/189, 226, 72, 208, 365/63, 214

[56] References Cited

U.S. PATENT DOCUMENTS

| 3,365,707 | 1/1968 | Mayhew ............................ 365/72 |
| 3,898,630 | 8/1975 | Hansen et al. ...................... 365/230 |
| 4,347,588 | 8/1982 | Hoffmann et al. ................. 365/208 |
| 4,394,657 | 7/1983 | Isogai et al. ..................... 365/155 X |
| 4,586,169 | 4/1986 | Itoh et al. ......................... 365/190 |
| 4,627,034 | 12/1986 | Herndon ........................... 365/226 |

Primary Examiner—James W. Moffitt
Assistant Examiner—Alyssa H. Bowler
Attorney, Agent, or Firm—Staas & Halsey

[57] ABSTRACT

A semiconductor memory device which includes a high potential source, a low potential source, and a word line driver portion which makes the potential of selected word lines a selection level lower by a predetermined potential than the high potential source. Memory cells are connected to the word lines. A first low potential source or a second potential source is connected to the low potential source. A plurality of transistors are provided in the word line driver portion so as to connect a plurality of stages. When the memory has a sufficient power source margin, the word line driver is formed as a two-stage device so as enable high speed operation. When the memory has an unsufficient power source margin, the word line driver is formed as a one-stage device so as to ensure a sufficient power source margin.

9 Claims, 5 Drawing Sheets

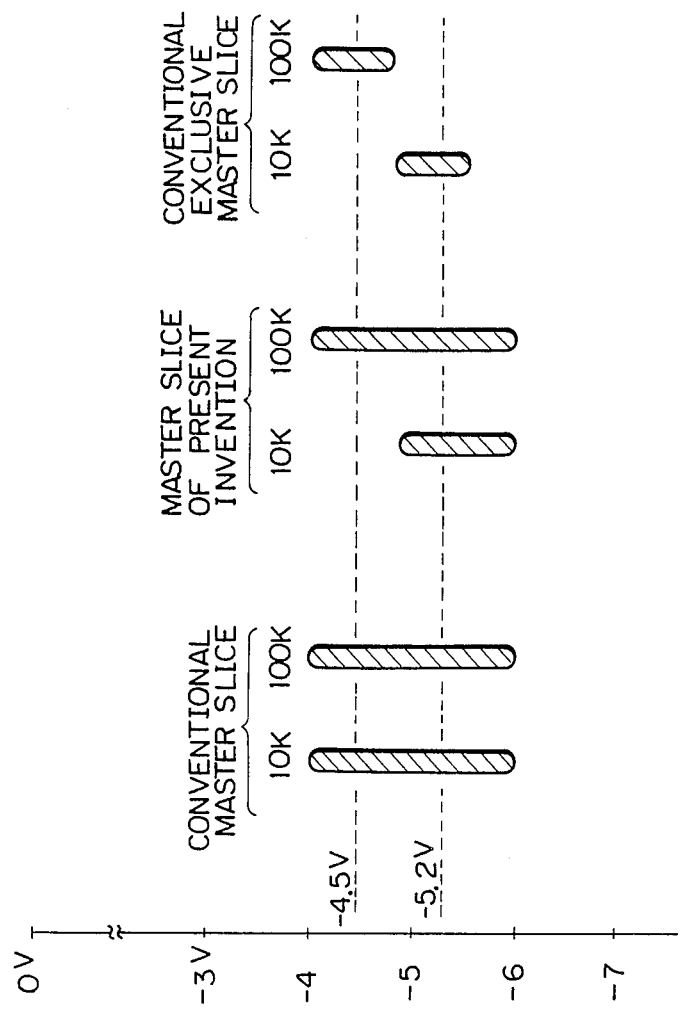

EMITTER COUPLED SEMICONDUCTOR MEMORY DEVICE HAVING A LOW POTENTIAL SOURCE HAVING TWO STATES

BACKGROUND OF THE INVENTION

1. Field of the Invention

The present invention relates to an emitter-coupled logic (ECL) type semiconductor memory device manufactured by a master slice method. More particularly, the present invention relates to an ECL type a semiconductor memory device with an optimal number of word line driver stages.

2. Description of the Related Art

ECL memory devices using bipolar transistors have been made with increasingly larger capacities in recent years. This has been accompanied by an increase of the load of the word lines. To deal with this increased load, it is effective to form the word line drivers as a two-stage emitter-follower (EF) construction or a Darlington connection to raise the drive capacity. This enables a high speed operation and low power consumption.

ECL memory devices come in two types, "10K" and "100k". The input and output levels of these are almost the same, but their temperature characteristics are different. That is, the 10K type device has a temperature coefficient the same as that of a forward voltage $V_F$ of a diode in the circuit, while the 100K type device internally compensates for the temperature characteristics to achieve the temperature coefficient of zero. Which type of device to be used depends on the specific application of the device.

Another difference between the two types of ECL memory devices lies in the voltage of the power source. An ECL memory device operates between an earth potential ($V_{CC}$) and a negative power source ($V_{EE}$). The negative power source voltage $V_{EE}$ is usually $-5.2$ V for a 10K type device and $-4.5$ V for a 100K type device. That is, a 10K type device can operate with a power source voltage of 0.7 V lower than the 100K type device, i.e., the power source margin of the 10K type device is larger than the 100K type device. Those two types of devices have the same latent power source margin.

The only difference in the conventional circuit constructions of the 100K and 10K type devices is that the 100K type device provides a diode in the output buffer gate compensating for the temperature characteristic of the output voltage and another diode for adjusting the threshold level of input buffer gate due to receiving constant voltage swings. Therefore, the 100K and 10K type devices can be manufactured by substantially the same wafer process. To manufacture the 100K type device the wiring process is changed to add the diodes. The method for producing devices of this type is called a master slice method.

When the word line driver is constructed in two stages, the voltage of the word lines becomes low and the voltage levels supplied to word lines and bit lines become low corresponding to the voltage drop of the word lines. This narrows the power source margin in the 100K type device, which must be operated in a voltage region around $-4.5$ V. Actually most memory devices which have two-stage word drivers cannot operate at $-4.5$ V.

This means that the word line driver in a 100K type device must be constructed in one stage. When using the master slice method and conventional circuit technology, therefore, even the 10K type device must have the word driver constructed in one stage. This, however, means a high-speed operation cannot be obtained with a 10K type device despite its sufficient power source margin.

SUMMARY OF THE INVENTION

An object of the present invention is to provide an ECL memory device manufactured by the master slice method which is able to form a two-stage word line driver having a sufficient power source margin so as to operate rapidly, or when necessary, to form a one-stage word line driver to secure a sufficient power source margin.

According to the present invention there is provided a semiconductor memory device including a high potential source ($V_{CC}$), a low potential source ($V_{EE}$), and a word line driver portion which is connected to the high potential source and which receives an address signal so as to make the potential of the selected word line a selection level lower by a predetermined potential than the high potential source. A plurality of memory cells are connected to the word lines. The low potential source may be connected to a first low potential source or a second low potential source which has a potential lower than the first low potential source. A plurality of driver transistors are provided in the word line driver portion to enable construction of a plurality of stages.

The number of stages of the driver transistors when the first low potential source is connected to the low potential source is less than when the second potential source is connected. The selection level of the word lines when the first low potential source is connected is higher than when the second low potential source is connected.

Further features and advantages of the present invention will be apparent from the ensuing description with reference to the accompanying drawings to which, however, the scope of the invention is in no way limited.

BRIEF DESCRIPTION OF THE DRAWINGS

FIG. 5 is a graph of the difference of the power source margin in the prior art and in the present invention.

DESCRIPTION OF THE PREFERRED EMBODIMENTS

Figure 1:
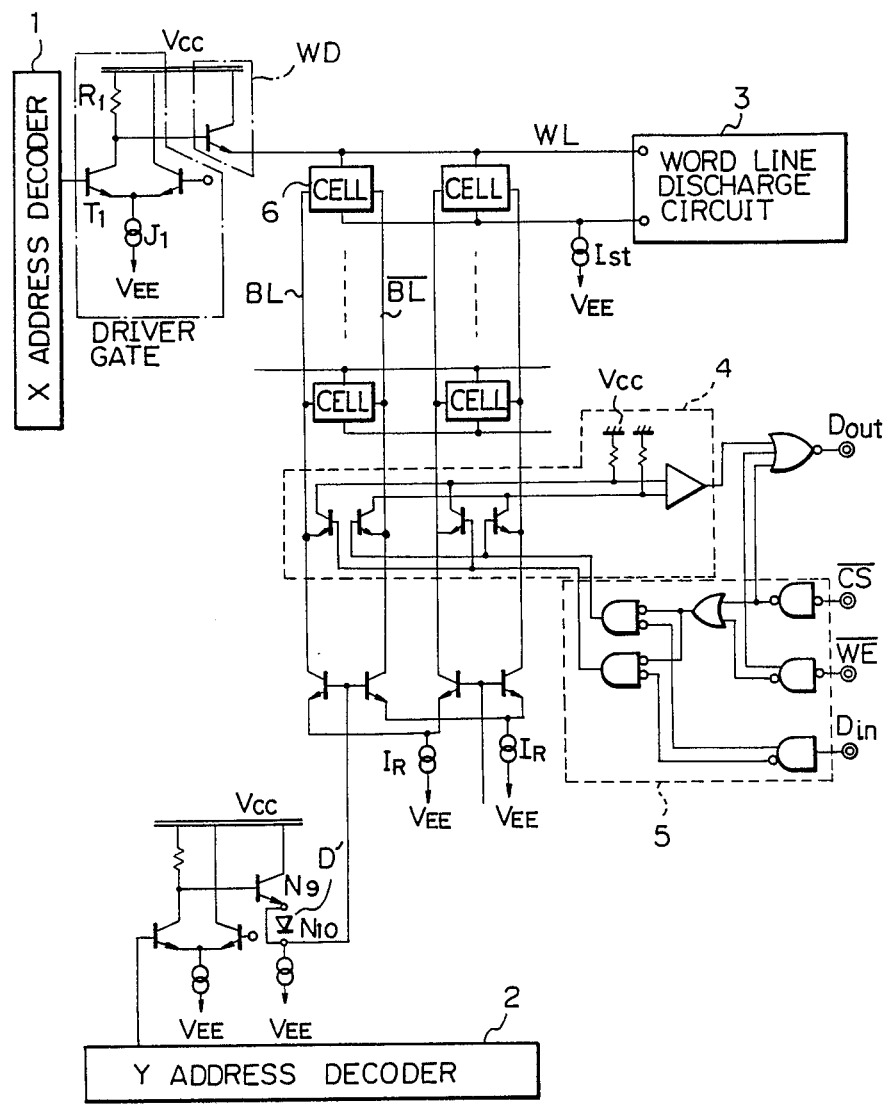
FIG. 1 is a schematic circuit diagram of an ECL memory device according to the present invention.

FIG. 1 is a schematic circuit diagram of an ECL memory device. In FIG. 1, 1 is an X address decoder for selecting a word line WL, 2 is a Y address decoder for selecting a bit line BL, 3 is a word line discharge circuit for discharging word lines WL so as to accelerate the decrease in the voltage level, 4 is a sense amplifier circuit which amplifies the selected cell information, 5 is a circuit which controls the read (R), write (W), and chip select (CS) operations, 6 are memory cells (Cell) arranged in a matrix, and WD is a word line driver.

When the chip select bar $\overline{CS}$ becomes L (low), the ELC memory chip can operate. When the write enable bar $\overline{WE}$ is low, the data $D_{in}$ is written into the cell 6 selected by the decoders 1 and 2. When the write enable bar $\overline{WE}$ is H (high), the data $D_{out}$ is read out from the cell 6 selected by the decoders 1 and 2. In FIG. 1, the word line driver WD is formed as one transistor, and thus, is "one-stage" construction.

Figure 2A:
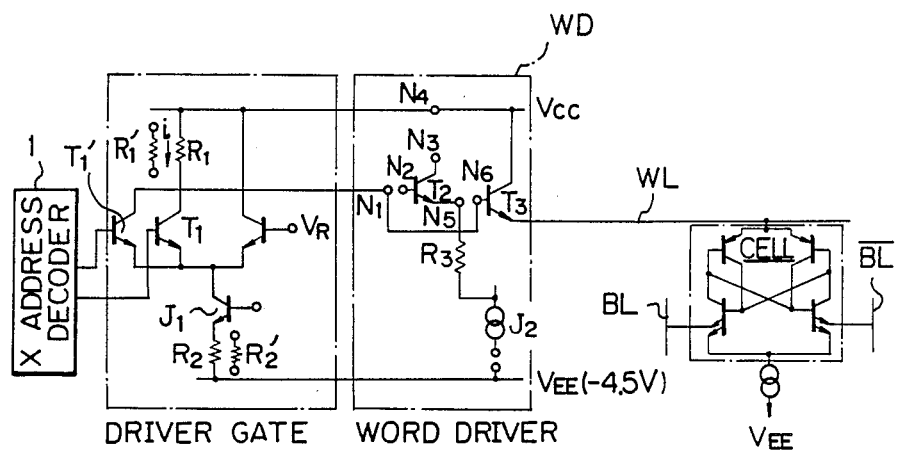
FIGS. 2A to 2D are diagrams of portions of an embodiment of the present invention and corresponding voltage level diagrams.
Figure 2B:
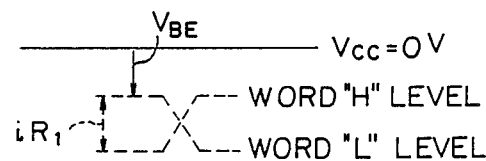
Figure 2C:
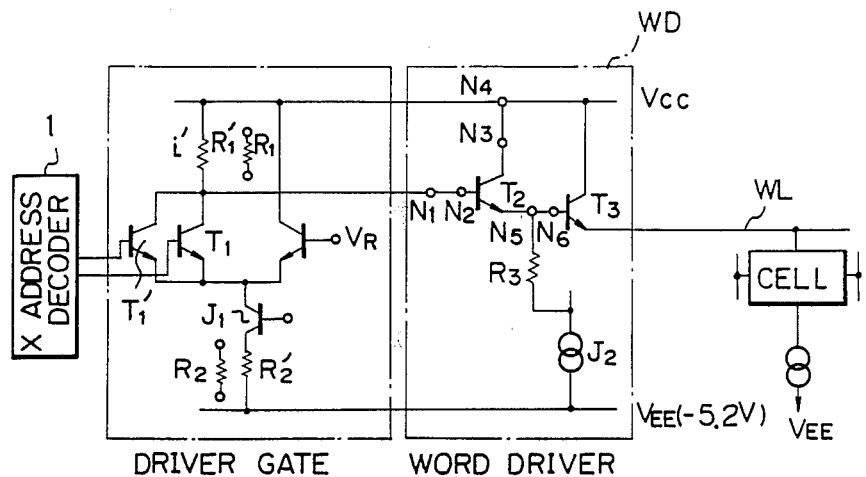
Figure 2D:
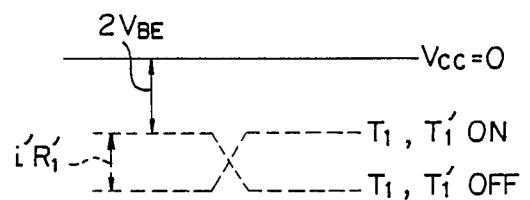

FIGS. 2A and 2C are circuit diagrams of essential portions of an embodiment of the present invention. That is, the construction of the X address decoder 1 to the word line driver WD in FIG. 1. FIGS. 2B and 2D are level diagrams of the circuits shown in FIGS. 2A and 2C, respectively. For selectively constructing a two-stage or one-stage device the word line driver WD is provided with two EF transistors $T_2$ and $T_3$. When a 100K type device having a high potential source $V_{EE}$, that is, $-4.5$ V, is desired, the connection shown in FIG. 2A is made. When a 10K type device having a low potential source $V_{EE}$, that is, $-5.2$ V, is desired, the connection shown in FIG. 2C is made.

In other words, in the case of a 10K type device, a two-stage construction is formed using the two EF transistors $T_2$ and $T_3$, an emitter resistor $R_2$ of the transistor $T_2$, and a constant current source $J_2$ (connected by wire) so as to raise the driveability of the device. In this respect, note, as shown in FIG. 2A and FIG. 2C, that two kinds of load resistors $R_1$ and $R_1'$ and resistors $R_2$ and $R_2'$ in the constant current source $J_1$ are provided.

In FIGS. 2A and 2C, the values of the resistors $R_1$ and $R_2$ are selected to be lower than the values of the resistor $R_1'$ and $R_2'$, respectively. In the case of the 10K type device shown in FIG. 2C, the resistors $R_1'$ and $R_2'$ are connected. As a result, the current $i'$ flowing in the resistor $R_1'$ is smaller than the current $i$ in the resistor $R_1$. By providing two types of transistors and by changing the connection of the transistors, it is possible to reduce the power loss. The relationship between the levels of the high potential source $V_{CC}$, the second low potential source $V_{EE}$, and the selected word line driver is shown in FIG. 2D. As shown in FIG. 2D, the selection level of the word line becomes lower by the value $2V_{BE}$ (corresponding to the two stages) than the high potential source $V_{CC}=0$ For the 100K type device, as shown in FIG. 2A, the transistor $T_2$, resistor $R_3$, and constant current source $J_2$ are not used. Connection is such that the output of the decoder 1 is directly supplied to the base of the transistor $T_3$. That is, the word line driver is formed in a one-stage construction. As shown in FIG. 2B, the potential of the selection level of the word line WL becomes higher by a value $V_{BE}$, corresponding to one stage, between the base and the emitter (above 0.7 V) of the transistor $T_2$, than the two-stage construction mentioned above.

As explained above, in the 10K type device, since the low potential source $V_{EE}$ is low enough, i.e., $-5.2$ V, the word driver includes two-stage driver transistors $T_2$ and $T_3$ so that the high speed operation is possible because a word line pulling up ability is better than in a one-stage driver. Furthermore, although the power consumption in the 10K type device will be large because of the low potential source, since the word driver comprises the two-stage driver, which can operate by feeding a smaller base current, the driver gate can use the larger resistance ($R_1'$ and $R_2'$). This means that the power consumption in the driver gate can be reduced so as to eliminate defects by using the low potential source.

On the other hand, in the 100K type device, since the low potential source $V_{EE}$ is not low enough, the word driver comprises only a one-stage word line transistor $T_3$. Therefore, even though the potential difference between the potential sources $V_{CC}-V_{EE}$ is small, since the word line selection level is high enough, the potential margin of the memory is large enough to secure proper operation of the device.

In the manufacturing process, a master bulk having two driver transistors $T_2$ and $T_3$, two sets of resistors $R_1$ and $R_1'$, $R_2$ and $R_2'$, a resistor $R_3$, and a current source $J_2$, is manufactured for both the 10K and 100K type devices. During the process of forming the wire patterns on the master bulk, 10K and 100K type devices are selectively produced by connecting or disconnecting the nodes $N_1$ through $N_6$, as shown in FIG. 2A and FIG. 2C.

Figure 3:
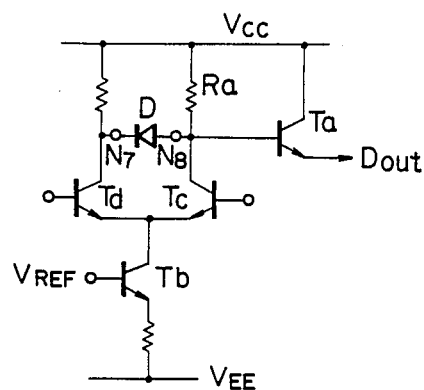
FIG. 3 is a circuit diagram of an ELC circuit.
Figure 4:
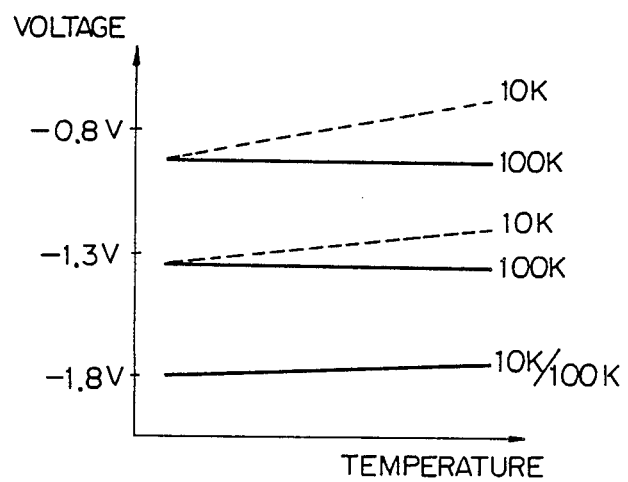
FIG. 4 is a graph of the temperature coefficient in an ELC circuit.

FIG. 3 is a circuit diagram showing the difference between the 10K and 100K type devices. As shown, a diode D is used for compensating the temperature in the 100K type device, but not in the 10K type device. This is achieved by connecting or not connecting the diode D between the nodes $N_7$ and $N_8$. The circuit is that of a usual ECL gate. In the case of a 10K type device, the temperature characteristic of the EF transistor $T_a$ and a resistor $R_a$ in the output stage appears at the output $D_{out}$. FIG. 4 is a graph of the temperature characteristics, the broken lines representing the 10K type device and the solid lines representing the 100K type device. If the intermediate value of the ECL level is assumed to be a standard $-1.3$ V, the H (high) level is assumed to be a standard $-0.8$ V and the L (low) level is a standard $-1.8$ V. The H level in a 100K type device considerably increases along with a temperature rise. The intermediate value then increases in value. The L level does not vary much at all.

The reason why the L level stabilizes is that the reference voltage $V_{REF}$ of the transistor $T_b$ which forms the constant current source, has a temperature characteristic. That is, temperature variations of the output level arise since the base-emitter voltage $V_{BE}$ of the transistor $T_a$ decreases when the temperature rises. If the current flowing in the resistor $R_a$ is made to increase when the temperature rises, the decrease of $V_{BE}$ can be compensated for and the output level can be made constant. The current flowing in the resistor $R_a$ can be changed by the current passed by the transistor $T_b$, that is, the base voltage $V_{REF}$. However, the H level appears when the transistor $T_c$ is in an off state, and is subject to the temperature characteristic of the resistor $R_a$ and the transistor $T_a$ and cannot be compensated for by the current passed by the transistor $T_b$.

Therefore, in the 100K type device, the diode D is connected as shown in FIG. 3. The base potential of the transistor $T_a$ is made constant by referring to the collector potential (this is stabilized at a low level) of the transistor $T_d$, which is on when the output is a high level. Then the emitter potential of the transistor $T_a$, that is, the output level, is clamped at a level which rises by $V_F$ from the L level collector potential of the stable transistor $T_d$, mentioned above, and falls by $V_{BE}$. The forward voltage $V_F$ of the diode D is equal to the base-emitter voltage $V_{BE}$ of the transistor $T_a$ (about 0.7 to 0.8 V), and the output level (H level) is equal to the L level collector potential of the transistor $T_d$, that is, it is constant.

At the L level, the output level $D_{out}$ has a value which is lower by a value corresponding to the base-emitter voltage $V_{BE}$ of the transistor $T_a$ in a one-stage device than the collector potential of the transistor $T_c$, which is also constant. Therefore, a temperature coefficient does not exist in the ECL gate of the 100K type device. However, in the 10K type device, since the diode D is not connected, the L level of the output does not change due to temperature variations. However, temperature variations in the base-emitter voltage $V_{BE}$ appear at the H level.

Regarding the determination of the potential of the 100K type device, a 100K type device having the above temperature characteristic usually is required to be able to operate at a power source voltage lower than that required by a 10K type device. If the word line driver is formed in two stages, the potential of the selected word line excessively decreases by an amount of $V_{BE}$ of a one-stage device. Therefore, a power source greater by this amount is required. A power source of −4.5 V of a 100K type device is thus impossible in a circuit construction of this type.

FIG. 5 is a graph of the power source margin with respect to various master slice methods. It shows the range of usable voltages (oblique line portions) for 10K and 100K type devices made by a conventional common master slice method, the master slice method of the present invention, and a conventional "exclusive" master slice method ("exclusive" meaning a method exclusively for forming 10K type and 100K type devices). The range of usable voltage is determined by taking a suitable margin between the minimum voltage which is required to operate the circuit elements as an upper limit and the high voltage at which breakdown of elements is caused as a lower limit. The power source range of the 10K and 100K type devices made by the conventional master slice method is set so as to cover −5.2 V to −4.5 V for the purpose of operation even at −4.5 V. Here, only the temperature compensation circuit is changed between the 10K and 100K type devices. The word line driver has a one-stage construction in both cases.

Even in conventional cases, 10K type devices have word line drivers constructed as two-stage devices. However, this is in the case of the exclusive 10K device master slice method and does not operate on a −4.5 V power source. In the case of the exclusive 100K device master slice method, the word line driver is constructed as a one-stage device and operates on a −4.5 V power source.

Contrary to this, the 100K type device produced by the common master slice method of the present invention is the same as that produced by the conventional common master slice method. Further, the 10K type device has a word line driver formed as a two-stage device. A power source of approximately −5.2 V is required by the 10K type device (the driver cannot operate on a −4.5 V power source), and the driveability of the device increases.

In the present invention, a common master slice method is used to produce the 10K and 100K type devices. Therefore, the word line driver is able to be formed as a two-stage device and a temperature compensation diode D is attachable (i.e., a semi-finished element provided on the master slice). When the word line driver is formed as a two-stage device, the memory portions must be adjusted accordingly. For example, it is required to adjust the level by inserting a diode into requisite portions, e.g., connecting the diode D′ between the nodes $N_9$ and $N_{10}$ as shown in FIG. 1. Such diodes are previously prepared. During the wiring process, the diode D′ is selectively connected according to the 10K or 100K device as are the word driver circuit and driver gate shown in FIGS. 2A and 2C.

As explained above, in a semiconductor memory device of an ECL type, generally, the driver transistor of the word line driver is placed on for the selected word line to place it at a selection level lower, by a predetermined level, than the high potential source $V_{CC}$. The non-selected word line is placed at a non-selection level lower than the selection level. The read and write operations are carried out by operating the ECL circuit with respect to the levels of the selected memory cell of the selected word line, the levels of the write transistors and read transistors, etc. Therefore, if the difference in levels between the high potential source $V_{CC}$ and the low potential source $V_{EE}$ is sufficiently large, the power source margin becomes large.

In the present invention, in the case of a 10K type device having a large difference between $V_{CC}$ and $V_{EE}$ (0 V and −5.2 V), the word line driver is formed as a two-stage device so as to enable a high speed operation. In the case of 100K type device having an insufficient difference between $V_{CC}$ and $V_{EE}$ (0 V and −4.5 V), the word line driver is formed as a one-stage device so as to ensure a sufficient power source margin. That is, the selection level of the word line WL becomes $(V_{CC}-2V_{BE})$ in the 10K type device and $(V_{CC}-V_{BE})$ in the 100K type device.

As explained above, according to the present invention, a 100K ECL memory device having no temperature coefficient at the ECL output level and a 10K ECL memory device having a temperature coefficient, can be manufactured by a common master slice method. Further, the word line driver in the a 10K ECL memory device is formed as a two-stage device, enabling a high-speed operation.

We claim:

1. A semiconductor memory device comprising:
   a high potential source;
   a low potential source;
   a first potential source operatively connectable to said low potential source;
   a second potential source, operatively connectable to said low potential source, having a potential lower than said first potential source;
   word lines, one of said word lines being selected and having a selection level lower than the high potential source by a predetermined potential, the remaining word lines being non-selected and having a non-selected level which is lower than the selection level;
   a plurality of memory cells, operatively connected to said word lines, formed by a pair of cross-connected transistors;
   a word line driver portion, operatively connected to said high potential source and said word line, for receiving an address signal for making the potential of the selected word line the selection level, said word line driver portion including:
     a plurality of driver transistors enabling construction of a plurality of stages, the number of stages of said driver transistors when said first potential source is connected to said low potential source being less than when said second potential source is connected to said low potential source, and the selection level of said word lines when said first potential source is connected being greater than when said second potential source is connected.

2. A semiconductor memory device according to claim 1, further comprising a driver gate circuit portion for constructing a driver gate circuit, operatively connected to said word line driver portion, for supplying a selection signal to said word line driver portion, said driver gate circuit portion including:

high power element means, operatively connected to and used in said driver gate circuit when said low potential source is connected to said first potential source, for providing a high power; and low power element means, operatively connected to and used in said driver gate circuit when said low potential source is connected to said second potential source, for providing a low power;

each of said driver transistors having a collector operatively connected to said high potential source, having a base operatively connected to receive said selection signal, and having an emitter operatively connected to said word lines.

3. A semiconductor memory device according to claim 1, further comprising:

a bit line driver; and level shift means, operatively connected to said bit line driver, said level shift means employed when said second potential source is connected, and said level shift means is not employed when said first potential source is connected.

4. A semiconductor memory device comprising:

a high potential source;

a low potential source;

a first potential source operatively connectable to said low potential source;

a second potential source operatively connectable to said low potential source, having a potential lower than said first potential source;

word lines, one of said word lines being selected and having a selection level, the remaining word lines being non-selected and having a non-selection level lower than the selection level;

a plurality of memory cells operatively connected to said word lines;

a word line driver portion, operatively connected to said high potential source, for receiving an address signal and making the potential of the selected word line the selection level, said word line driver portion including:

a plurality of driver transistors for enabling construction of a plurality of stages by a wiring, the number of stages of the driver transistors in which said first low potential source is connected being less than when said second potential source is connected.

5. A semiconductor memory device including memory cells, comprising:

a high potential source;

a low potential source having first and second potential levels;

word driver means operatively connected between said high potential source and said low potential source;

word lines, operatively connected to the memory cells and said word driver means, one of said word lines being selected, said word driver means lowering the potential of said selected word line by a predetermined potential so as to make the potential of said selected word line lower than the potential of said high potential source;

said word driver means including driver transistors, groups of said driver transistors operatively connected such that said low potential source has one of said first and second potential levels, said selected word line having a higher potential selection level when said low potential source has said first potential level than when said low potential source has said second potential level.

6. A semiconductor device according to claim 5, wherein said word driver means further includes:

a word driver; and a driver gate circuit, operatively connected to said word driver, for supplying a selection signal to said word driver.

7. A semiconductor memory device comprising:

a high potential source;

a low potential source;

driver means operatively connected between said high potential source and said low potential source, said driver means including:

a driver gate, said driver gate including:

a first load resistor pair operatively connected to said high potential source;

a first transistor operatively connected to said first load resistor pair;

a first constant current source operatively connected to said first transistor; and a second load resistor pair operatively connected between said first constant current source and said low potential source;

a word driver including:

a second constant current source operatively connected to said low potential source;

a resistor operatively connected to said second constant current source; and a second transistor operatively connected between said resistor and said high potential source.

8. A semiconductor memory device according to claim 7, wherein a first load resistor of said first load resistor pair is operatively connected between said high potential source and said first transistor, wherein a first load resistor of said second load resistor pair is operatively connected between said first constant current source and said low potential source, and wherein a second load resistor of said first load resistor pair and a second load resistor of said second load resistor pair are unconnected so as to form a 100K type device.

9. A semiconductor memory device according to claim 7, wherein a second load resistor of said first load resistor pair is operatively connected between said high potential source and said first transistor, wherein a second load resistor of said second load resistor pair is operatively connected between said first transistor and said low potential source, wherein a first load resistor of said first load resistor pair and said first load resistor of said second load resistor pair are unconnected, wherein said second transistor is operatively connected between said driver gate and said high potential source, and wherein said constant current source is connected to said low potential source so as to form a 10K type device.

* * * * *

UNITED STATES PATENT AND TRADEMARK OFFICE
CERTIFICATE OF CORRECTION

PATENT NO. : 4,740,918
DATED : APRIL 26, 1988
INVENTOR(S) : YOSHINORI OKAJIMA ET AL.

It is certified that error appears in the above-identified patent and that said Letters Patent is hereby corrected as shown below:

Col. 2, line 49, "ELC" should be --ECL--;

line 51, "ELC" should be --ECL--.

Col. 3, line 2, "ELC" should be --ECL--.

Signed and Sealed this

Seventh Day of May, 1991

Attest:

HARRY F. MANBECK, JR.

Attesting Officer

Commissioner of Patents and Trademarks